(12) United States Patent
Davies et al.

(10) Patent No.: US 11,910,533 B2
(45) Date of Patent: Feb. 20, 2024

(54) PROFILED THERMODE

(71) Applicant: PRAGMATIC PRINTING LTD., Sedgefield (GB)

(72) Inventors: Neil Davies, Sedgefield (GB); Stephen Devenport, Sedgefield (GB); Richard Price, Sedgefield (GB)

(73) Assignee: PRAGMATIC PRINTING LTD., Sedgefield (GB)

( * ) Notice: Subject to any disclaimer, the term of this patent is extended or adjusted under 35 U.S.C. 154(b) by 506 days.

(21) Appl. No.: 17/269,626

(22) PCT Filed: Jul. 30, 2019

(86) PCT No.: PCT/GB2019/052134
§ 371 (c)(1),
(2) Date: Feb. 19, 2021

(87) PCT Pub. No.: WO2020/039164
PCT Pub. Date: Feb. 27, 2020

(65) Prior Publication Data
US 2021/0307225 A1    Sep. 30, 2021

(30) Foreign Application Priority Data

Aug. 22, 2018 (GB) ..................................... 1813649

(51) Int. Cl.
*B23K 1/00* (2006.01)
*H05K 13/04* (2006.01)
(Continued)

(52) U.S. Cl.
CPC ....... *H05K 13/0469* (2013.01); *B23K 1/0016* (2013.01); *H01L 21/50* (2013.01);
(Continued)

(58) Field of Classification Search
CPC .... H05K 13/0469; H05K 1/118; H05K 3/323; H05K 2203/0195; H01L 21/50;
(Continued)

(56) References Cited

U.S. PATENT DOCUMENTS 4,166,562 A    9/1979 Keizer et al.
4,412,123 A    10/1983 Ammann et al.
(Continued)

FOREIGN PATENT DOCUMENTS

CN    102113421 A  *  6/2011  ......... G02F 1/13452
CN    106158760 A  *  11/2016  ............... B81C 3/00
(Continued)

OTHER PUBLICATIONS

Lai, Yn-Huei et al. "Study of ACF Bending Technoiogy in Flexible Display Module Packages" SID Symposium Digest of Technical Papers / vol. 46, Issue 1 / Chap. 4.2; Abstract Only; Jul. 19, 2015.
(Continued)

*Primary Examiner* — Kiley S Stoner
(74) *Attorney, Agent, or Firm* — Jason H. Vick; Sheridan Ross, PC (57) ABSTRACT

The invention relates to a thermode for connecting at least two components, comprising a tip having a body portion with at least two contact surface portions connected to and spaced apart from one another by a recess configured to receive a portion of one of the at least two components; and a support portion having at least one supporting surface portion configured to support a further component (being the other of the at least two components, wherein the contact surface portions and the supporting surface portion are configured to receive the at least two components between them and wherein one or both of the contact surface portions and the supporting surface portion are moveable relative to and towards one another to exert heat and/or pressure on the
(Continued)

at least two components located between the contact surface portions and the supporting portion.

6 Claims, 5 Drawing Sheets

(51) Int. Cl.
| | |
|---|---|
| *H01L 21/50* | (2006.01) |
| *H01L 23/00* | (2006.01) |
| *H05K 1/11* | (2006.01) |
| *H05K 3/32* | (2006.01) |
| *H01L 21/60* | (2006.01) |

(52) U.S. Cl.
CPC .............. *H01L 24/32* (2013.01); *H01L 24/83* (2013.01); *H05K 1/118* (2013.01); *H05K 3/323* (2013.01); *H01L 2021/60277* (2013.01); *H01L 2224/32148* (2013.01); *H01L 2224/83203* (2013.01)

(58) Field of Classification Search
CPC ............... H01L 24/32; H01L 24/83; H01L 2021/60277; H01L 2224/32148; H01L 2224/83203; H01L 24/29; H01L 2224/2929; H01L 2224/293; H01L 2224/32227; H01L 2224/75303; H01L 2224/75305; H01L 2224/7531; H01L 2224/75651; H01L 2224/75983; H01L 2224/83851; H01L 2924/1015; H01L 24/75; B23K 3/0471; B23K 1/0016; B23K 2101/36–42; B23K 3/0638; B23K 3/025
USPC ..... 228/179.1–180.22, 6.1–6.2, 248.1–248.5
See application file for complete search history.

(56) References Cited

U.S. PATENT DOCUMENTS

| | | | |
|---|---|---|---|
| 5,081,336 A | 1/1992 | Schuster et al. | |
| 5,490,786 A | 2/1996 | Mosquera et al. | |
| 5,650,081 A | 7/1997 | Hudson | |
| 6,055,722 A | 5/2000 | Tighe et al. | |
| 8,851,356 B1 * | 10/2014 | Holec | H01R 4/02 228/103 |
| 9,669,481 B1 | 6/2017 | Schmitz | |
| 2009/0057374 A1 | 3/2009 | Chen et al. | |

FOREIGN PATENT DOCUMENTS

| | | | | |
|---|---|---|---|---|
| CN | 216162757 U | * | 4/2022 | ............. G02B 7/025 |
| DE | 4123987 A1 | | 1/1993 | |
| DE | 10105164 A1 | | 5/2002 | |
| DE | 102009004652 A1 | | 7/2010 | |
| EP | 0032437 A1 | | 7/1981 | |
| FR | 2612821 A1 | | 9/1988 | |
| JP | H1154668 A | * | 2/1999 | |
| JP | 2004356143 A | * | 12/2004 | ............. H01L 24/32 |
| JP | 2009-032845 A | | 2/2009 | |
| WO | WO-2007094614 A1 | * | 8/2007 | ............. H05K 3/361 |
| WO | WO-2021100747 A1 | * | 5/2021 | ......... H01L 23/3107 |

OTHER PUBLICATIONS

Schneider, Josef et al. "Process Guideline: Anisotopic Conductive Adhesives +Non Conductive Adhesive for Flex on PCB / for Flip Chip on Flex / for Flip Chip on PCB" Henkel LOCTITE MRD 03-13 ACF; Jul. 2003.
International Search Report for International Application No. PCT/GB2019/052134, dated Nov. 14, 2019.
Written Opinion for International Application No. PCT/GB2019/052134, dated Nov. 14, 2019.
Search Report for Great Britain Application No. 1813649.9, dated Feb. 19, 2019.
Examination Report Under Section 18(3) for Great Britain Application No. 1813649.9, dated Nov. 24, 2021.
International Preliminary Report on Patentability for International Application No. PCT/GB2019/052134, dated Mar. 4, 2021.

* cited by examiner

PROFILED THERMODE

CROSS-REFERENCE TO RELATED APPLICATIONS

This application is a national stage application under 35 U.S.C. 371 of PCT Application No. PCT/GB2019/052134 having an international filing date of 30 Jul. 2019, which designated the U.S., which PCT application claimed the benefit of Great Britain Application No. 1813649.9, filed 22 Aug. 2018, each of which are incorporated herein by reference in their entirety.

This invention relates to a thermode for use in connecting at least two components, particularly, though not exclusively to a thermode for use in connecting flexible integrated circuits and application circuits using conductive adhesive or the like.

The invention further relates to a thermode system for use in connecting at least two components and a method for connecting flexible electronic chips and application circuits using conductive adhesive or the like.

BACKGROUND

An inexpensive way to attach chips, or integrated circuits, to flexible circuits is via the use of an anisotropic conductive adhesive (ACA; also referred to as anisotropic conductive paste (ACP), anisotropic conductive film (ACF) and z-axis adhesive. ACA consists of an adhesive organic binder with a filling material of conductive particles. When such a paste is placed between the chip and application circuit contacts and pressed (with heat, using flat thermodes) the particles are pressed into the contacts, leading to conduction between them. However, the particles are isolated in the non-conductive adhesive matrix, so no lateral conduction takes place. The binder cures thermally to secure the bond.

This widely used technique allows the assembly of circuits (e.g. application circuits) and chips (e.g. integrated circuits (ICs)) without accurate and hence time consuming and/or costly placement of conductive adhesive onto small contacts. Instead the conductive adhesive can cover the whole area of the chip without causing an electrical short circuit. In addition there is no need to apply an additional non-conductive adhesive to provide mechanical integrity to the chip/circuit assembly.

For flexible ICs ("FlexICs") one problem with the above approach is that the thermodes have to apply high pressures to squeeze the adhesive between the FlexIC and circuit until the adhesive is a little thinner than the diameter of the conductive particles. Whilst this works well for bonding hard silicon chips to rigid or flexible circuits, flexible chips such as FlexICs may have a relatively soft, and very thin (perhaps less than 1 µm), protective layer between the FlexIC's circuitry and the conductive adhesive layer. There is therefore a risk that the conductive particles in the adhesive, which may be several microns in diameter, may be pressed into the FlexIC's circuits (components), causing electrical shorting or other damage.

Thermodes are devices used for local application of heat and pressure, typically in soldering and adhesive applications. Once the thermode is brought into contact with a desired location, localized heating is typically produced by direct resistance heating of the contact surface of the thermode.

Thermode soldering typically provides a rapid temperature change (up to 1000° Celsius per second) with precise control over the temperature while the component parts are being mechanically held by thermode contact pressure. For adhesive bonding temperatures may be up to 200° C., sometimes higher (for example, up to 350° C.), depending on the adhesive chosen for the particular bond. Since the hottest portion of the thermode is typically in direct contact with the component bond area, efficient heat transfer occurs and rapid heating of the component is possible. The bond area is the area(s) of the component being processed where a bond, such as a thermal/pressure activated adhesive bond, is desired between at least two surfaces.

A thermode typically includes the following elements: Terminals: electrical contacts where power is applied; Mount: means of mechanically supporting the thermode; Shank: means of supporting the tip and conducting current to it; Tip: high resistance section where the majority of heat is developed; Transition zone: means of joining the tip to the shank; Contact surface: the portion of the tip, which comes in contact with the component to be heated; and a Thermocouple: a device for determining the working temperature, attached to the tip near the working surface.

The present invention provides at least an alternative to thermodes of the prior art.

BRIEF SUMMARY OF THE DISCLOSURE

In accordance with the present invention there is provided a thermode for connecting at least two components, a system comprising two or more thermodes for connecting at least two components and a method of connecting flexible electronic chips (e.g. integrated circuits) and application circuits using conductive adhesive or the like in accordance with the appended claims.

When used herein the term "thermode" means a heated element configured and arranged to provide heat and pressure onto one or more surfaces of a component to form a bonded join between two elements.

In accordance with an aspect of the invention there is provided a thermode for connecting at least two components, the thermode comprising a tip having a body portion with at least two contact surface portions connected to and spaced apart from one another by a recess configured to receive a portion of one of the at least two components; and a support portion having at least one supporting surface portion configured to support a further component (being the other of the at least two components, wherein the contact surface portions and the supporting surface portion are configured to receive the at least two components between them and wherein one or both of the contact surface portions and the supporting surface portion are moveable relative to and towards one another to exert heat and/or pressure on the at least two components located between the contact surface portions and the supporting portion.

In certain embodiments the at least two components are components of an electronic circuit. More specifically, one of the at least two components is a flexible chip, integrated circuit or the like. The further component of the at least two components is a circuit, application circuit of the like.

In certain embodiments the at least two contact surface portions are connected to and spaced apart from one another by a recess configured to receive a portion of a flexible component (e.g. a chip, IC, FlexIC).

In certain embodiments the at least two contact surface portions are connected to and spaced apart from one another by a recess configured to receive a portion of the further component (e.g. circuit, application circuit).

In certain embodiments the support portion having at least one supporting surface portion is configured to support a further component being a circuit or application circuit.

In certain embodiments the support portion having at least one supporting surface portion is configured to support a further component being a flexible component (e.g. a chip, IC, FlexIC).

In certain embodiments, the contact surface portion(s) and the supporting surface portion are moveable towards one another to form a bonding zone of the thermode. More specifically, the bonding zone comprises a contact surface portion and a supporting surface which are configured to co-operate to exert a bonding heat and pressure on the components between them. In this way a bond area is formed on the flexible component and the further component. The bond area typically comprises a contact pad on the flexible component, one or more conductive particles in a conductive adhesive located between the flexible component and a contact pad on the further component.

In certain embodiments, there are one or more bonding zones. More specifically, two or more contact surface portions and the supporting surface portion are moveable towards one another to form two or more bonding zones in which the two or more contact surface portions and a supporting surface are configured to co-operate to exert a bonding heat and pressure on the components between them.

In certain embodiments one of: the two or more contact surface portions and the supporting surface portion is moveable towards the other to form two or more bonding zones in which the two or more contact surface portions and a supporting surface are configured to co-operate to exert a bonding heat and pressure on the components between them. More specifically, in certain embodiments, the supporting surface portion may be stationary and the two or more contact surface portions are moveable towards the supporting surface portion. Alternatively, in certain embodiments, the two or more contact surface portions are stationary and the supporting surface portion is moveable towards the two or more contact surface portions.

In certain embodiments the at least two contact surface portions are heated. In this way, as one or both of the at least two contact surface portions and the supporting surface portion are moved towards one another the at least two contact surface portions are configured to exert heat and pressure on the flexible component and the further component.

In certain embodiments the supporting surface portion is heated. In this arrangement, heat may be applied to the flexible circuit and to the further component (e.g. circuit, application circuit) between the at least two contact surface portions and the supporting surface portion. More specifically, heat may be applied directly to the flexible circuit and to the further component (e.g. circuit, application circuit) between the at least two contact surface portions and the supporting surface portion. In this way, even heating the materials in the joint avoids having a hot and a cold side of the joint, thereby reducing differential shrinkage of the components and/or an uneven curing of the adhesive in the joint.

In certain embodiments the thermode comprises at least one roller. More specifically, the tip is mounted on a roller and the supporting portion is located adjacent the roller.

In certain embodiments a plurality of tips may be mounted on a roller. In this way the roller forms the shank of the thermode. The roller may be part of an apparatus for forming integrated electronic components comprising a flexible integrated circuit bonded at electrically conductive contact pads to an application circuit.

In certain embodiments the at least two contact surface portions may be at least two planar and substantially parallel contact surface portions.

In certain embodiments, the supporting surface portion may be planar. In this way a flat surface is provided to receive the further component (e.g. circuit, application circuit), conductive adhesive and flexible component (e.g. chip, integrated circuit, FlexIC) respectively. The contact surface portion(s) is/are moveable towards the supporting surface to form one or more bonding zones. In this way, the flexible component is bonded to the further component by the conductive adhesive when heat and pressure are applied to the flexible component by the tip of the thermode. Conductive particles in the conductive adhesive in the bond area form an electrically conductive join with the contact pads on the two components in the bond area. Further, the conductive particles will not puncture the flexible component in the area of the recess in the body of the tip of the thermode.

In certain embodiments, the supporting surface portion is non-planar. More specifically, the supporting surface may be shaped to correspond to the shape of the tip of the thermode.

In certain embodiments the, or each recess comprises a base and at least two side walls. More specifically, the side walls of the recess form the side walls of the body of the tip ending at the contact surface portions.

By forming a channel in the body of the tip, the recess provides a space so that in areas between flexible chip (e.g. flexible integrated circuit) contact pads the particles in the conductive adhesive (ACA; ACF; ACP) are not pressed into the circuitry embedded in the substrate of the flexible chip and lying beneath its surface causing damage and potential short circuits.

In certain embodiments each side wall is up to 5 μm in height. More specifically, the distance between the plane of the contact surface portion(s) and the plane of the base of the recess is up to 5 μm. In this way, a flexible component (e.g. chip, IC, FlexIC) comprising at least one embedded electrical circuit and a pair of contact pads can be placed onto an anisotropic conductive adhesive itself on a circuit comprising a corresponding pair of contact pads. Connection between the flexible component, anisotropic conductive adhesive and the circuit caused by the application of heat and pressure by the thermode will not cause the conductive particles in the adhesive to puncture the flexible component, which would risk causing damage to the embedded electrical circuit, due to the recess receiving the flexible component and the embedded electrical circuit away from the bonding zones of the thermode.

In certain embodiments, each side wall is more than 5 μm in height. More specifically, the distance between the plane of the contact surface portion(s) and the plane of the base of the recess is more than 5 μm. In this way, larger electrical components/circuits can be embedded in the flexible component without risk of damage by the conductive particles in the adhesive puncturing the surface of the flexible component.

In certain embodiments the angle between the, or each side wall and the base of the recess is greater than or equal to 90 degrees. Although it is optional that the angle between the, or each side wall and the base of the recess is less than 90 degrees, this embodiment is not preferred because the flexible component may bend and ultimately may stick in the recess.

In certain embodiment the body portion of the tip tapers towards the contact surface portions. More specifically the cross sectional area of the body portion of the tip towards the contact surface portions is smallest at the contact surface portions that is the end remote from the base of the recess.

In certain embodiments, the base of the recess may be at right angles to the side walls. Alternatively, the base of the recess is concave between the side walls. In this way, non-planar circuits (e.g. flexible antenna circuits comprising protruding antenna windings may be bonded to a flexible chip (e.g. integrated circuit) without the body of the tip of the thermode pressing the conductive particles of the adhesive into the flexible components and the associated circuitry (e.g. antenna windings).

In certain embodiments the body of the tip is a unitary body formed from a heat-conducting material.

In certain embodiments the unitary body comprises opposing upper and lower faces. More specifically, the contact surface portions and recess are located in a face of the unitary body. More specifically, the contact surface portions and recess are located in a lower face of the unitary body.

In certain embodiments the body has a C-shaped vertical cross-section. More specifically the at least two contact surface portions are each located at the end of a stem portion for the body, which stem portions depend from a common connector portion of the body. The stem portions of the body are spaced apart and connected to one another by the connector portion. The stem portions have the recess between them and each have a contact surface portions on an end opposite the connector portion.

In certain embodiments the further component is rigid. More specifically, the further component is a silicon chip, application circuit or the like.

In certain embodiments the further component is flexible. More specifically, the further component is a flexible polymer chip, application circuit or the like.

In accordance with a further aspect of the present invention, there is provided a thermode system comprising at least two thermodes. More specifically, the system comprises at least two thermodes according to aspects of the present invention.

In certain embodiments, the system comprises opposing thermodes configured to receive at least two components between them and to join the at least two components by heat and pressure. More specifically, the opposing thermodes may be upper and lower thermodes. The terms "upper" and "lower" should be taken to refer to the relative orientation of the thermodes to one another and should not be taken to imply any orientation with respect to the ground. For example, the terms "upper" and "lower" should be taken to include the terms "left" and "right" in the event the thermodes are arranged next to one another.

In certain embodiments, the supporting surface portion of the upper thermode may comprise the at least two contact surface portions of the lower thermode.

In certain embodiments the supporting surface portion of the lower thermode may comprise the at least two contact surface portions of the upper thermode.

Thus, the thermode system comprises two thermode tips each configured to exert heat and pressure on a component of an electronic circuit and a further component of an electronic circuit between them. In this way, two profiled thermode tips are provided which may further reduce the risk of conductive particles from the adhesive being pressed into the flexible chip and/or circuit.

In certain embodiments the at least two contact surface portions of the tip and the at least two contact surface portions of the further tip are moveable towards one another and are operable to co-operate with one another to form at least two bonding zones in which bond areas are formed on a flexible component and a further component between them.

In certain embodiments the at least two contact surface portions of the thermode (for example one at either end of the chip) are flat and are aligned parallel with the corresponding areas of the further (opposing) thermode tip.

According to a yet further aspect the present invention provides a method for connecting a flexible chips (e.g. integrated circuits) and an application circuit using conductive adhesive or the like using a thermode according to the present invention.

In certain embodiments the thermode may be a thermode in a thermode system according to the present invention.

In certain embodiments the method comprises providing a thermode in accordance with the present invention; providing a circuit onto the supporting surface portion and forming a layer of conductive adhesive (e.g. anisotropic conductive adhesive) on the circuit; providing a flexible chip (e.g. integrated circuit) onto the conductive adhesive layer so that the contact pads of the circuit and the flexible chip are aligned with one another; applying heat and pressure to the flexible chip and circuit in the region of the contact pads and forming an electrically conductive joint between them.

In certain embodiments a buffer layer of flexible, porous material is provided on the flexible chip. In this way, the integrity of the joint is preserved whilst also reducing the volume of expensive conductive adhesive required to fill the joint. The flexible, porous material may also provide further protection to the upper surface of the flexible chip as the thermode applies heat and pressure to the contact pads.

In certain embodiments the conductive adhesive is provided as a substantially uniform layer. Alternatively, the conductive adhesive is provided as discrete regions on the circuit.

In certain embodiments the flexible chip is picked and placed onto the conductive adhesive. Alternatively the flexible chip is transferred by roller onto the conductive adhesive.

In certain embodiments the flexible chip (e.g. IC) contact pads may be coplanar with the surface of the flexible chip (e.g. IC), or they may protrude beyond the flexible chip (e.g. IC) surface or be recessed inside the flexible chip (e.g. IC) surface. Typically, the depth of any protrusion or recess of the flexible chip (e.g. IC) contact pads is smaller than the average size of conductive particles in the conductive adhesive (e.g. ACA).

In certain embodiments the profiled thermode may perform thermal curing of the conductive adhesive (e.g. ACA), preserving the integrity of the bond.

BRIEF DESCRIPTION OF THE DRAWINGS

Embodiments of the invention are further described hereinafter with reference to the accompanying drawings, in which.

DETAILED DESCRIPTION

Like reference numerals are used to depict like features in FIGS. 1 to 4.

Figure 1:
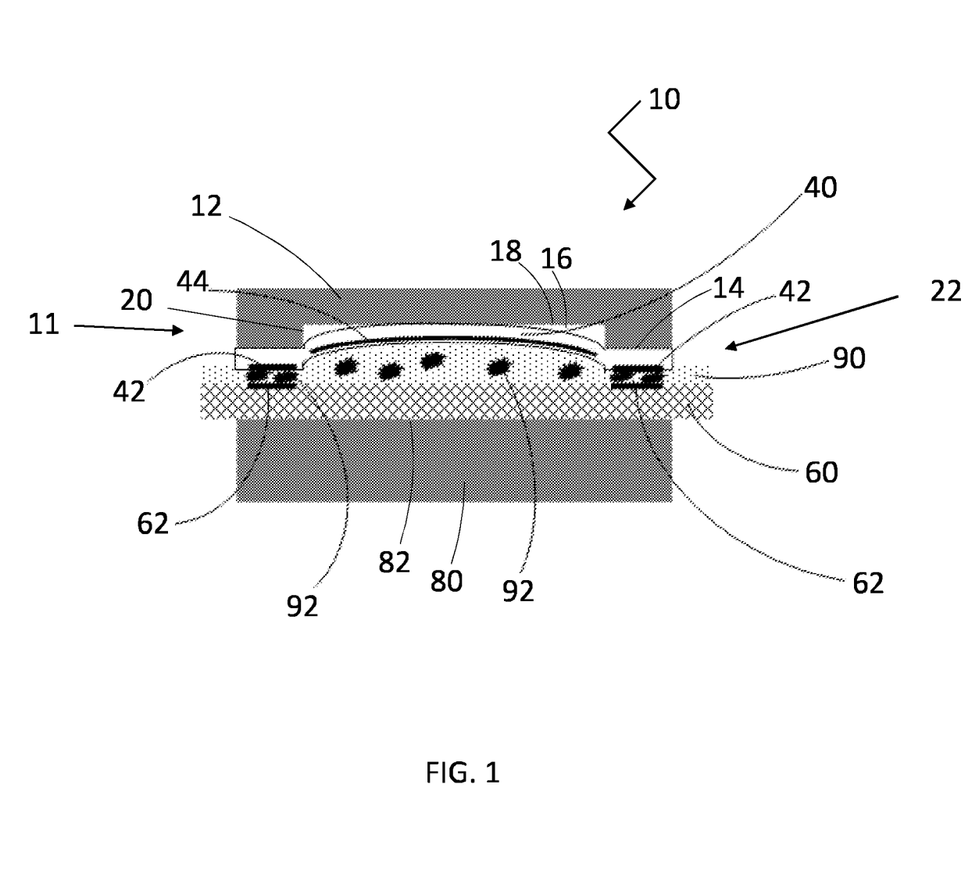
FIG. 1 is a schematic representation of a thermode in accordance with an embodiment of the invention.

FIG. 1 shows a schematic representation of a thermode according to a first embodiment configured to connect a flexible integrated circuit 40 and a flexible circuit 60.

The thermode 10 comprises a tip 11 comprising a metal, heat-conducting body portion 12 having two planar contact surface portions 14 which are connected to and spaced apart from one another by a recess 16. The recess 16 has a base 18 and two side walls 20 at right angles to one another. The recess 16 forms a channel in the body 12

The thermode 10 further comprises a support portion 80 having a single, planar supporting surface portion 82. The supporting surface portion 82 is aligned parallel with the contact surface portions 14 of the body portion 12. In use, the support surface portion 82 receives a portion of a flexible circuit 60.

The contact surface portions 14 and the supporting portion 80 are moveable relative to and towards one another, forming a bonding zone between the surfaces of portions 14 and 80. The body 12 is moveable towards support portion 80 in the depicted embodiment, however it will be understood that in alternative embodiments, the supporting portion 80 may move towards a static body 12 or, in a further alternative, both the body 12 and the support portion 80 may move towards one another. In all arrangements, the direction of movement is in the plane of the page.

In use, flexible circuit 60, being an application circuit or the like, having contact pads 62 on a surface of the substrate, is placed on supporting surface 80. An anisotropic conductive adhesive layer 90 is positioned onto flexible circuit 60. The conductive adhesive layer 90 comprises conductive particles 92 each with a diameter in the order of 5 µm.

A flexible integrated circuit 40 having embedded electronic circuits 44 and contact pads 42 on a surface of the substrate is positioned on the conductive adhesive layer 90. The body portion 12 and/or the supporting portion 80 of the thermode 10 are moved towards one another so that heat and pressure are exerted in the area of the contact pads 42 and 62. The conductive particles 92 in the area of contact pads 42 and 62 form an electrically conductive join between the contact pads thus connecting the flexible integrated circuit and the flexible circuit 60. More specifically, contact is made between the flexible integrated circuit 40 and the adhesive layer 90 at the flexible integrated circuit contact pads 42, and contact is made between the flexible circuit 60 and the adhesive layer 90 at the flexible circuit contact pads 62.

The recess 16 provides space to receive a portion of the flexible integrated circuit (FlexIC) 40. The depth of the recess 16 corresponds to at least 50% of the maximum diameter of the conductive particles 92 in the anisotropic conductive adhesive 90 which forms a layer between the flexible integrated circuit 40 and the circuit 60. In the depicted embodiment, the depth of the recess is 5 µm and the conductive particle diameter is 5 µm. In this way, the areas of the flexible integrated circuit 40 that are to remain undamaged, such as the flexible integrated circuit electronic circuits 44 are located in the area of the recess 16. As the support portion 80 and body portion 12 are moved towards one another, the conductive particles 92 are compressed between contact pads 42 and 62 on the flexible integrated circuit 40 and the circuit 60 respectively. The conductive particles 92 in the region of the recess 16 are not pressed into the flexible integrated circuit and, therefore, no damage to the embedded circuits 44 occurs. The contact surface portions 14 are configured to contact the contact the flexible integrated circuit in the area of the contact pads 42.

The recess 16 has a depth in the order of micrometers (µm). A depth of this magnitude prevents the conductive particles 92 being crushed into the flexible circuit 60 positioned beneath the conductive adhesive layer 90. The movement of one or both of the contact surface portions 14 and the supporting portion 80 relative to and towards one another forces the flexible integrated circuit 40 and the adhesive layer 90 to deform and fill the recess 16. The movement of the contact surface portions 14 and the supporting portion 80 forms a bonding zone 22, where the adhesive layer 90 can be cured, to preserve the integrity of the bond between the flexible integrated circuit 40 and the flexible circuit 60.

In the depicted embodiment, the base 18 of the recess 16 is at an angle of 90 degrees to the side walls 20. However, it will be appreciated that the recess 16 may be non-parallel to the contact surface portions 14. For example, the recess 16 may be smoothly concave. The circuit 60 is a flexible circuit. In alternative embodiments, the circuit 60 may be rigid.

Figure 2:
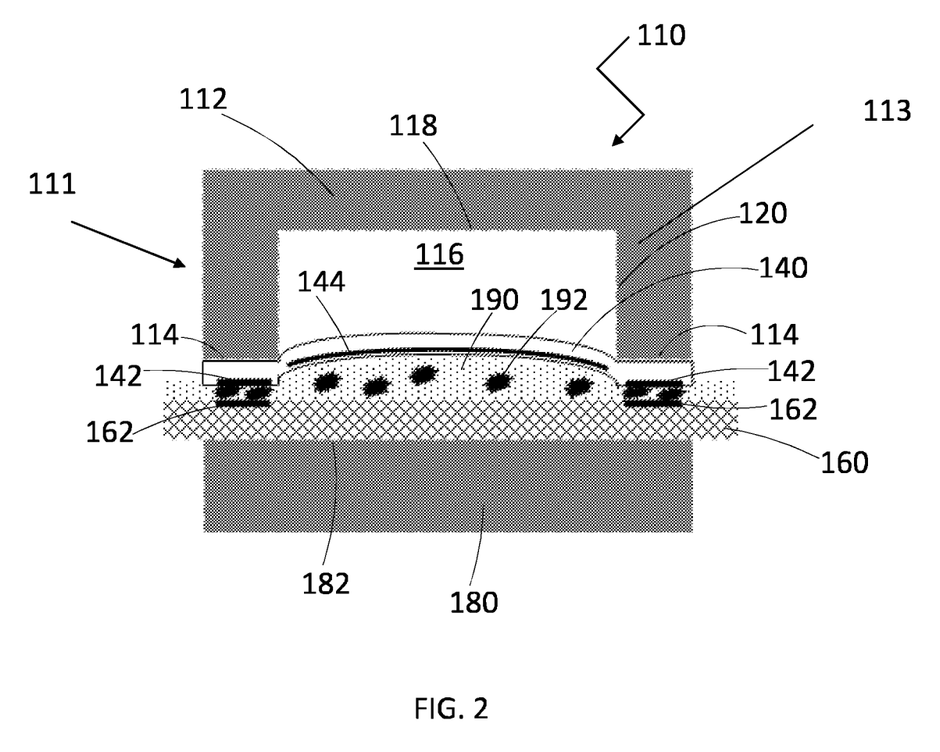
FIG. 2 is a schematic representation of a thermode in accordance with a further embodiment of the invention.

FIG. 2 shows a schematic representation of a thermode according to a further embodiment configured to connect a flexible integrated circuit 40 and a circuit 60. The circuit 60 is a flexible circuit. In alternative embodiments, the circuit 60 may be rigid.

The features in FIG. 2 are similar to those shown in FIG. 1 with similar features depicted by the same reference numeral, increased by a factor of 100. FIG. 2 shows a thermode 110 comprising a tip 111 having a body portion 112 with two planar contact surface portions 114 which are connected to and spaced apart from one another by a recess 116. The recess 116 has a larger depth profile than the recess 16 of FIG. 1. The recess 116 has a base 118 and two side walls 120 with the side walls in the depicted arrangement being greater than 5 µm in length from the plane of the base 118 to the plane of the contact surface portions 114. Each side wall 120 of the recess 116 forms a side wall 120 of the stem portions 113 of the body having a contact surface portions 114 at an end of the stem portion 113.

The depth of the recess 116 is greater than that of the recess 16 in FIG. 1. In this way there is provided more space to receive a portion of the flexible integrated circuit 140, allowing more areas (i.e. flexible integrated circuits 144) of the flexible integrated circuit 140 to remain undamaged as the body 112 and the supporting portion 180 move towards one another. The deeper recess 116 further reduces the risk of pressing conductive particles 192 into the flexible circuit 160.

The recess 116 provides space to receive a portion of the flexible integrated circuit 140. The depth of the recess 116 corresponds to the areas of the FlexIC 140 that are to remain undamaged, such as the FlexIC circuits 144.

In use, flexible circuit 160, being an application circuit or the like, having contact pads 162 on a surface of the substrate, is placed on supporting surface 180. An anisotropic conductive adhesive layer 190 is positioned onto flexible circuit 160. The conductive adhesive layer 190 comprises conductive particles 192 each with a diameter in greater than 5 µm.

A flexible integrated circuit 140 having embedded electronic circuits 144 and contact pads 142 on a surface of the substrate is positioned on the conductive adhesive layer 190. The body portion 112 and/or the supporting portion 180 of the thermode 110 are moved towards one another so that heat and pressure are exerted in the area of the contact pads 142 and 162. The conductive particles 192 in the area of contact pads 142 and 162 form an electrically conductive join between the contact pads thus connecting the flexible integrated circuit and the flexible circuit 160. More specifically, contact is made between the flexible integrated circuit 140 and the adhesive layer 190 at the flexible integrated circuit contact pads 142, and contact is made between the flexible circuit 160 and the adhesive layer 190 at the flexible circuit contact pads 162.

Figure 3:
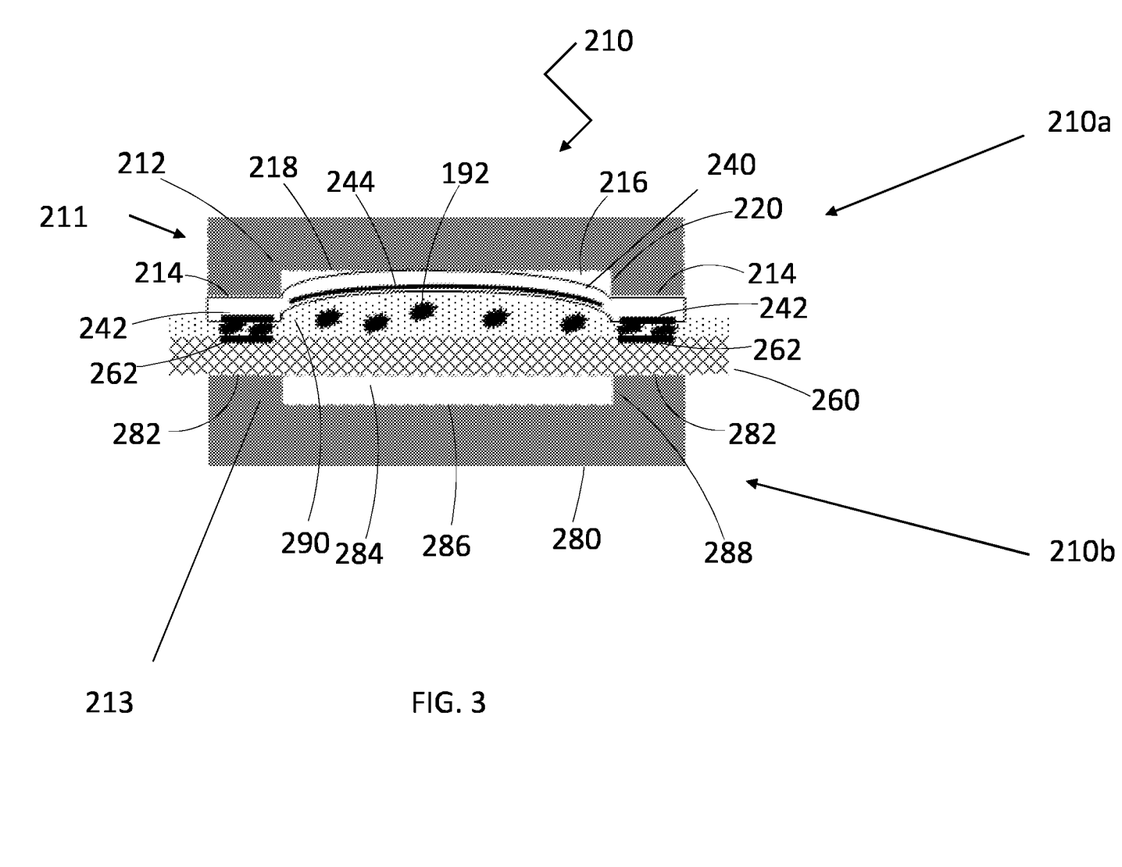
FIG. 3 is a schematic representation of a thermode system in accordance with an embodiment of the invention.

FIG. 3 shows a schematic representation of a thermode system 210 according to an embodiment of the present invention. The thermode system 210 is configured to connect a flexible integrated circuit and a flexible circuit 280.

The features in FIG. 3 are similar to those shown in FIG. 1 with similar features depicted by the same reference numeral, increased by a factor of 200 FIG. 3 shows a thermode system 210 having an upper thermode 210a comprising a tip 211 having a body portion 212 with two planar contact surface portions 214 which are connected to and spaced apart from one another by a recess 216, the recess 216 providing space to receive a portion of a flexible integrated circuit 240 and a conductive adhesive layer 290 positioned between the flexible integrated circuit 240 and the flexible circuit 260.

In FIG. 3, a lower thermode 210b provides the supporting portion 280 of the upper thermode 210a. The lower thermode 210b comprises two planar contact surface portions 282, the contact surface portions 282 connected to and spaced apart from one another by a recess 284. In this way, the lower thermode 210b features a depth profile, corresponding to that of the body portion 212. The recess 284 comprises a base 286 and two side walls 288. Each side wall 288 of the support recess 284 forms a side wall 288 of the each of stem portions 213 of the body 280 having a contact surface portion 282 at an end of the stem portion 213. In this way, the contact surface portions 214, 282 of the body portion 212 and the supporting (body) portion 280 are aligned with one another. By having a recess 216 in the upper thermode 210a and a recess 284 in the lower thermode 210b positioned either side of the flexible integrated circuit 240 and the flexible circuit 260, the risk of pressing conductive particles 292 into the flexible integrated circuit 240 is reduced.

In use, flexible circuit 260, being an application circuit or the like, having contact pads 262 on a surface of the substrate, is placed on lower thermode 210b, more specifically on the contact surface portions 282. An anisotropic conductive adhesive layer 290 is positioned onto flexible circuit 260. The conductive adhesive layer 290 comprises conductive particles 292 each with a diameter in the order of 5 μm.

A flexible integrated circuit 240 having embedded electronic circuits 244 and contact pads 242 on a surface of the substrate is positioned on the conductive adhesive layer 290. The body portion 212 of the upper thermode 210a and/or the supporting portion 280 provided by the body of the lower thermode 210b are moved towards one another so that heat and pressure are exerted by both the upper and the lower thermodes 210a and 210b in the area of the contact pads 242 and 262. The conductive particles 292 in the area of contact pads 242 and 262 form an electrically conductive join between the contact pads thus connecting the flexible integrated circuit and the flexible circuit 260. More specifically, contact is made between the flexible integrated circuit 240 and the adhesive layer 290 at the flexible integrated circuit contact pads 242, and contact is made between the flexible circuit 260 and the adhesive layer 290 at the flexible circuit contact pads 262. The recesses 218 and 284 avoid the body of the thermodes 212, 280 compressing any conductive particles 292 into the flexible integrated circuit 240 and/or the flexible circuit 282, thus avoiding potential damage to the embedded circuits 244.

Figure 4:
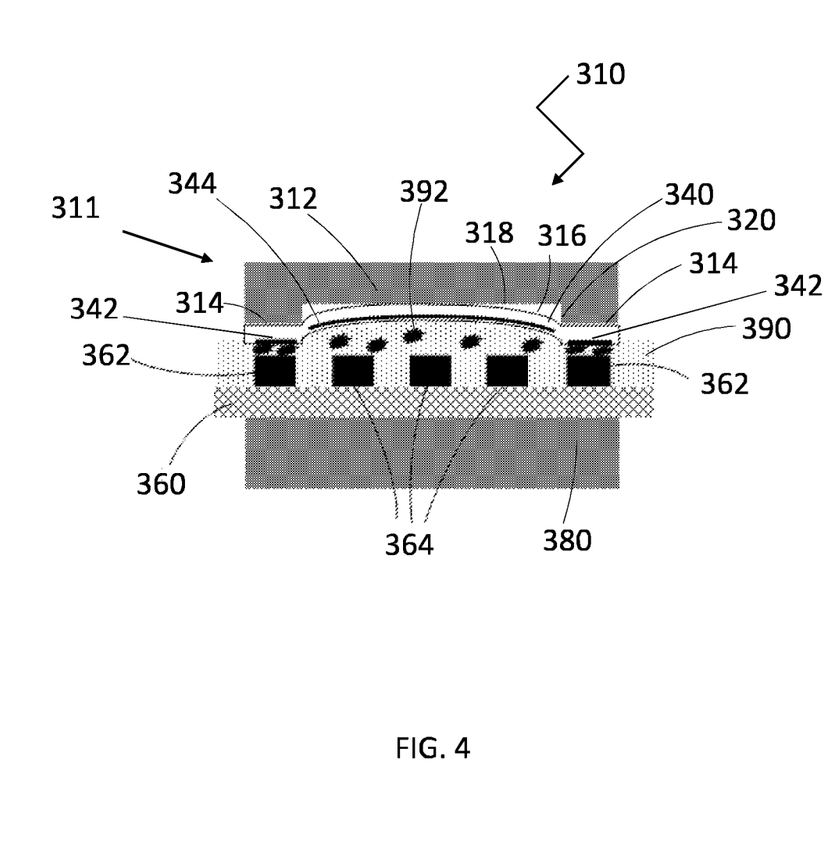
FIG. 4 is a schematic representation of a thermode in accordance with an even further embodiment of the invention.

FIG. 4 shows a schematic representation of a thermode 310 according to an even further embodiment configured to connect a flexible integrated circuit 340 and a flexible circuit 360.

The features in FIG. 4 are similar to those shown in FIG. 1 with similar features depicted by the same reference numeral, increased by a factor of 300. FIG. 4 shows a thermode 310 comprising a tip 311 comprising a body portion 312 having two planar contact surface portions 314 which are connected to and spaced apart from one another by a recess 316, the recess 316 providing space to receive a portion of a flexible integrated circuit 340, a planar supporting portion 380 configured to receive a flexible circuit 360 and a conductive adhesive layer 390 positioned between the flexible integrated circuit 340 and the flexible circuit 360.

In FIG. 4, the flexible circuit 360 is non-planar and comprises antenna windings 364 protruding from the surface of the flexible circuit 360. The antenna windings 364 are positioned between the flexible circuit 360 and the flexible integrated circuit 340. The recess 318 ensures that as the body portion 312 and the supporting portion 380 move towards one another, the antenna windings 364 are positioned in the region of the recess 318 and are not damaged by the body 312 as the bond is formed in the region of contact pads 342 and 362. Even if the conductive adhesive particles 392 are located in the area of the antenna windings 364, the recess 318 allows the flexible integrated circuit 340 and the embedded circuits 244 in the flexible integrated circuit 340 to be received in the recess rather than being pressed towards the conductive particles 392 and the antenna windings 364.

Figure 5:
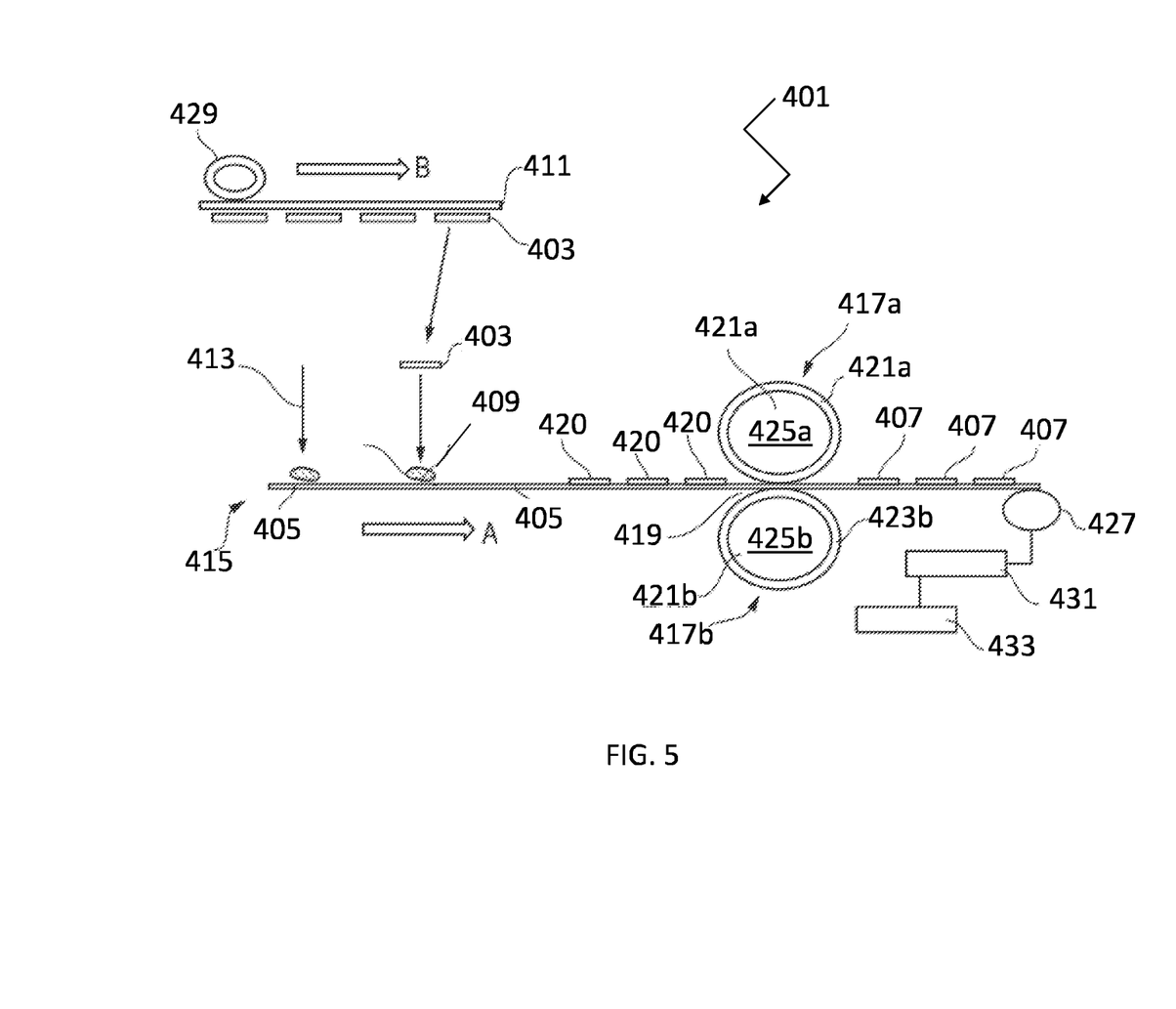
FIG. 5 is a schematic representation of a thermode system in accordance with a further embodiment of the invention.

FIG. 5 shows a schematic representation of a thermode 410a according to a further embodiment configured to connect a flexible integrated circuit 403 and flexible circuit. An apparatus 401 for bonding a plurality of flexible integrated circuits 403 to a plurality of respective application circuits 405 to form a plurality of complete electronic circuits 407 utilising a curable conductive adhesive 409 is shown.

The flexible integrated circuits 403 are initially provided on a common support 411. Conductive adhesive 409 is dispensed from a nozzle 413 onto an application circuit 405 formed on first structure 415 in the form of a flexible web of polyethylene terephthalate (PET). Each application circuit 405 comprises contact pads (not shown), upwardly facing from the surface of the flexible web 415.

The flexible web 415 is translated in the direction "A" by drive means (not shown) towards a pair of rollers 417a and 417b. The pair of rollers 417a and 417b have a gap 419 therebetween through which the flexible web 415. Comprising a plurality of IC/adhesive/application circuit assemblies 420 is continuously translated. The adhesive in assembly 420 is uncured. Each roller 417a, 417b comprises a core 421a, 421b and an outer surface 423a, 423b comprising a thermode in accordance with the present invention (not shown). The thermode of each roller is heated by a heating element 425a, 425b.

The heated thermodes compress the IC/adhesive/application circuit as it passes between the rollers 417a and 417b forming the completed circuits 407. The roller 427 is arranged to support the flexible web 415 and is controllable to translate the flexible web 415 relative to the thermodes on rollers 417a and 417b and into the gap 419 between them.

Roller 429 is arranged to support common support 411 comprising the plurality of flexible integrated circuits 403. Roller 429 is driven by a drive means (not shown) such as a motor or the like and is operable to move the common support 411 in direction "B".

Nozzle 413 is operable to dispense curable conductive adhesive onto the flexible web 415 and onto each application circuit 405.

A pick and place device (or transfer roller) (not shown) is used to transfer the flexible integrated circuits 403 from the common support 411 onto a respective application circuit 405 such that each group of contact pads of the flexible integrated circuits is mounted on (brought into electrical contact with) a respective group of contact pads on each application circuit 405.

The heating elements 425a and 425b are operable to heat the thermode of roller 417a and the thermode of roller 417b respectively and to cure the curable conductive adhesive in each assembly 420 to produce an electronic circuit 407 in which the adhesive is cured and the flexible integrated circuit 403 and the application circuit 405 are adhered to one another.

A roller driver 431 comprising a drive motor is controllable to drive roller 427 to translate the flexible web 415 relative to said roller 417a and opposing roller 417b.

A controller unit 433 is arranged to control the roller driver 431 and first and second support means (rollers 427, 429) to transfer said flexible integrated circuits from the common support 411 onto the flexible web 415 such that each group of terminals is mounted on (brought into electrical contact with) a respective group of contact pads.

The control unit 433 is arranged to control the distance between the rotational axes of the pair of rollers 417a and 417b. In this way, the gap 419 between the adjacent surfaces, and therefore the thermodes of the rollers at their narrowest point is controlled by the control unit 433.

The thermode on the outer surface 423b comprises a tip (not shown), substantially as described in the aforementioned embodiments, comprising a body portion (not shown), the body portion having two planar contact surface portions (not shown) which are connected to and spaced apart from one another by a recess (not shown). The recess is configured to receive at least a portion of the flexible integrated circuits 403.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A method to connect a flexible chip and an application circuit using conductive adhesive, the flexible chip and the conductive adhesive being adapted to deform into a recess of a thermode during use, that includes a tip having a body portion with at least two contact surface portions connected to and spaced apart from one another by a recess configured to receive a portion of one of at least two components; and a support portion having at least one supporting surface portion configured to support a further component of the at least two components, wherein the at least two contact surface portions and the at least one supporting surface portion are configured to receive the at least two components between the at least two contact surface portions and the at least one supporting surface portion and wherein one or both of the at least two contact surface portions and the at least one supporting surface portion are moveable relative to and towards one another to exert heat and pressure on the at least two components located between the at least two contact surface portions and the at least one supporting portion,
the method comprising:
providing the thermode;
providing a flexible circuit onto the supporting surface portion and forming a layer of conductive adhesive on the flexible circuit;
providing a flexible chip onto the conductive adhesive layer so that a contact pad of the flexible circuit and a contact pad of the flexible chip are aligned with one another; and
applying heat and pressure to the flexible chip and the flexible circuit in a region of the contact pads and forming an electrically conductive joint between the contact pads.

2. The method according to claim 1, wherein a buffer layer of flexible, porous material is provided on the flexible chip.

3. The method according to claim 1, wherein the conductive adhesive is provided as a substantially uniform layer.

4. The method according to claim 1, wherein the conductive adhesive is provided as discrete regions on the flexible circuit.

5. The method according to claim 1, wherein the flexible chip is picked and placed onto the conductive adhesive.

6. The method according to claim 1, wherein the thermode performs thermal curing of the conductive adhesive.

* * * * *